(12) United States Patent
Asuri et al.

(10) Patent No.: US 6,928,094 B2
(45) Date of Patent: *Aug. 9, 2005

(54) LASER DRIVER CIRCUIT AND SYSTEM

(75) Inventors: Bhushan Asuri, Oak Park, CA (US); Taesub Yoon, Calabasas, CA (US)

(73) Assignee: Intel Corporation, Santa Clara, CA (US)

( * ) Notice: Subject to any disclaimer, the term of this patent is extended or adjusted under 35 U.S.C. 154(b) by 86 days.

This patent is subject to a terminal disclaimer.

(21) Appl. No.: 10/321,177

(22) Filed: Dec. 16, 2002

(65) Prior Publication Data

US 2004/0114649 A1 Jun. 17, 2004

(51) Int. Cl.$^7$ .............................................. H01S 3/00
(52) U.S. Cl. .................................. 372/38.02; 372/38.1
(58) Field of Search ............................ 372/38.1–38.04

(56) References Cited

U.S. PATENT DOCUMENTS

| | | | | |
|---|---|---|---|---|
| 5,268,916 A | * | 12/1993 | Slawson et al. | 372/29.021 |
| 5,268,917 A | * | 12/1993 | Davies | 372/29.011 |
| 5,502,298 A | * | 3/1996 | Geller | 250/205 |
| 5,754,576 A | | 5/1998 | Kusano et al. | |
| 5,802,089 A | | 9/1998 | Link | |
| 5,850,409 A | | 12/1998 | Link | |
| 5,883,910 A | | 3/1999 | Link | |
| 5,978,393 A | * | 11/1999 | Feldman et al. | 372/31 |
| 6,055,252 A | * | 4/2000 | Zhang | 372/34 |
| 6,408,013 B1 | * | 6/2002 | Akagi et al. | 372/29.021 |
| 6,414,974 B1 | * | 7/2002 | Russell et al. | 372/38.02 |
| 6,494,370 B1 | * | 12/2002 | Sanchez | 235/454 |
| 6,549,310 B1 | * | 4/2003 | Kuchta et al. | 1/1 |
| 6,587,530 B1 | * | 7/2003 | Conklin et al. | 375/372 |
| 6,629,638 B1 | * | 10/2003 | Sanchez | 235/454 |
| 6,654,565 B2 | * | 11/2003 | Kenny | 398/182 |
| 2002/0172240 A1 | * | 11/2002 | Kwark | 372/26 |
| 2003/0007525 A1 | * | 1/2003 | Chen | 372/31 |
| 2004/0008745 A1 | * | 1/2004 | Magoon | 372/38.02 |

FOREIGN PATENT DOCUMENTS

| | | |
|---|---|---|
| JP | 01 080880 | 3/1989 |
| JP | 07 335986 | 12/1995 |

OTHER PUBLICATIONS

PCT International Search Report dated Apr. 23, 2004, related International Application No. PCT/US 03/36309, International Filing Date Nov. 12, 2003 (8 pgs.).

2002 IEEE, Standard Draft, Reconciliation Sublayer (RS) and 10 Gigabit Media Independent Interface (XGMII), May 1, 2002, 37 pages.

Data Sheet for Summit Microelectronics, Inc. part SML 2108 (Dual Laser Diode Adaptive Power Controller with Look UpTable, Oct. 3, 2001, 21 pages.

Data Sheet for Maxim Integrated Products part MAX3865 (2.5 Gbps Laser Driver Automatic Modulation Control, Apr. 2, 16 pages.

Data Sheet for Evaluation Kit for Maxim Integrated Products part MAX 3865, Feb. 2, 14 pages.

* cited by examiner

*Primary Examiner*—Minsun Oh Harvey
*Assistant Examiner*—Phillip Nguyen
(74) *Attorney, Agent, or Firm*—Grossman, Tucker, Perreault & Pfleger, PLLC

(57) ABSTRACT

A laser driver circuit to provide a current signal to power a laser device is described. A bias current provided to the laser device may be changed while changes in the output power of a light signal from the laser device is monitored. A slope efficiency associated with the laser device may be determined based upon the changes in the bias current and changes in the output power.

25 Claims, 7 Drawing Sheets

LASER DRIVER CIRCUIT AND SYSTEM

BACKGROUND

1. Field

The subject matter disclosed herein relates to data communication systems. In particular, the subject matter disclosed herein relates to transmitting data in an optical transmission medium.

2. Information

Data transmission in an optical transmission medium such as fiber optic cabling has enabled communication at data rates of 10 gigabits per second and beyond according to data transmission standards set forth in IEEE Std. 802.3ae-2002, Synchronous Optical Network/Synchronous Digital Hierarchy (SONET) protocol as indicated in a set of standards provided by the American National Standards Institute (ANSI T1.105.xx) or Synchronous Digital Hierarchy (SDH) as indicated in a set of recommendations provided by the International Telecommunications Union (e.g., ITU-T G.707, G.708, G.709, G.783 and G.784). To transmit data in the optical transmission medium, a laser device typically modulates an optical signal in response to a data signal.

FIG. 1 shows a schematic diagram of a prior art laser driver circuit 2 to provide power to a laser diode 6. In response to a pulse data signal 4, the laser driver circuit 2 provides a pulse current signal 12 and a nominally fixed bias current (not shown) to the laser diode 6. In response to the pulse current signal 12, the laser diode 6 transmits a light signal 10 having an output power 14. A photodiode 8 measures the output power 14 to be used in evaluating the performance of the laser driver circuit 2 or the laser diode 6.

A "slope efficiency" typically expresses an efficiency of a laser device in generating an output power in response to an input current signal. For example, a slope efficiency is typically expressed as a measurement of a change in output power of a light signal from a laser device divided by a magnitude of a change in input current signal provided to the laser device to transmit the light signal when the laser device is properly biased. The slope efficiency associated with a particular laser device typically changes as a function of age or operating temperature. For example, FIG. 2 shows a graph illustrating effects of temperature (i.e., different temperatures $T_1$, $T_2$ and $T_3$) on a slope efficiency of a laser device. In the illustrated example, the laser device has a higher slope efficiency at lower operating temperatures.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
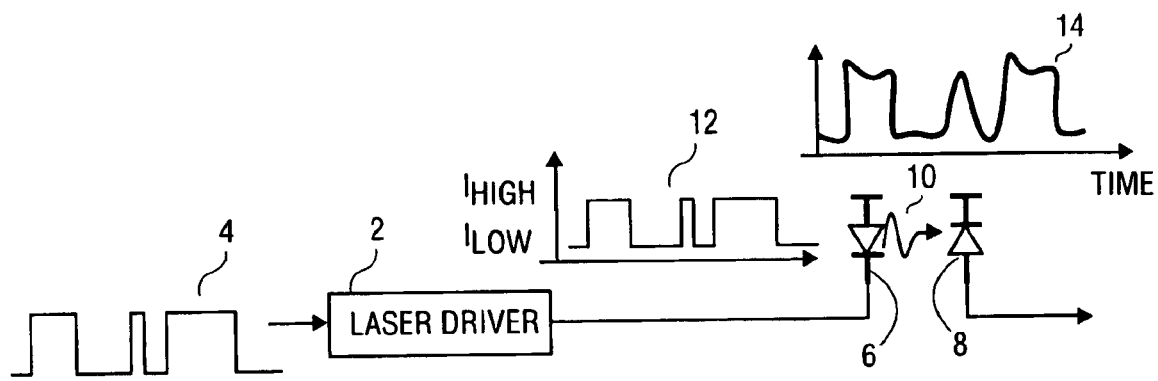
FIG. 1 shows a schematic diagram of a prior art laser driver circuit to provide power to a laser device.
Figure 2:
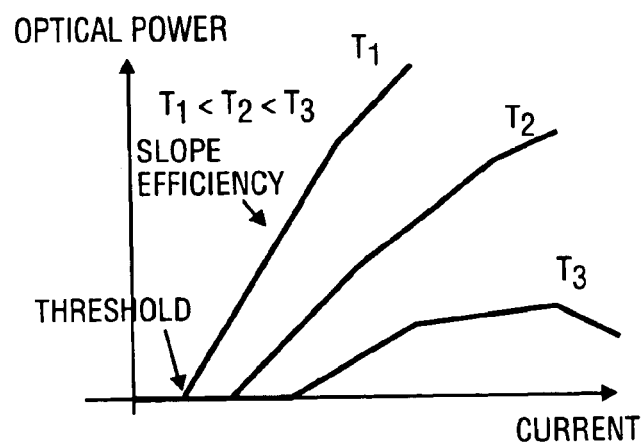
FIG. 2 shows a graph illustrating typical effects of temperature on a slope efficiency associated with a laser device.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

"Machine-readable" instructions as referred to herein relates to expressions which may be understood by one or more machines for performing one or more logical operations. For example, machine-readable instructions may comprise instructions which are interpretable by a processor compiler for executing one or more operations on one or more data objects. However, this is merely an example of machine-readable instructions and embodiments of the present invention are not limited in this respect.

"Storage medium" as referred to herein relates to media capable of maintaining expressions which are perceivable by one or more machines. For example, a storage medium may comprise one or more storage devices for storing machine-readable instructions or data. Such storage devices may comprise storage media such as, for example, optical, magnetic or semiconductor storage media. However, this is merely an example of a storage medium and embodiments of the present invention are not limited in this respect.

"Logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a storage medium in combination with processing circuitry to execute such machine-readable instructions. However, these are merely examples of structures which may provide logic and embodiments of the present invention are not limited in this respect.

A "data bus" as referred to herein relates to circuitry for transmitting data between devices. A "multiplexed data bus" as referred to herein relates to a data bus that is capable of transmitting data among two or more devices coupled to the multiplexed data bus. A multiplexed data bus may transmit data messages to a device coupled to the multiplexed data bus according to an address associated with the device or a position on the multiplexed data bus where the device is coupled. However, this is merely an example of a multiplexed data bus and embodiments of the present invention are not limited in this respect.

An "optical transmission medium" as referred to herein relates to a transmission medium capable of transmitting light energy in an optical signal which is modulated by a data signal such that the data signal is recoverable by demodulating the optical signal. For example, an optical transmission medium may comprise fiber optic cabling coupled between a transmitting point and a receiving point. However, this is merely an example of an optical transmission medium and embodiments of the present invention are not limited in this respect.

A "laser device" as referred to herein relates to a device to transmit a light signal in response to a power source. For example, a laser device may transmit a light signal in an optical transmission medium which is modulated by a data signal. However, this is merely an example of a laser device and embodiments of the present invention are not limited in these respects.

A "laser driver circuit" as referred to herein relates to a circuit to provide power to a laser device to be used for transmitting a light signal in an optical transmission medium. For example, a laser driver circuit may provide a controlled current signal to provide power for transmitting the light signal. However, this is merely an example of a laser driver circuit and embodiments of the present invention are not limited in these respects.

A laser driver circuit may provide a current signal to a laser device having a "bias current" component combined with a data current component which is modulated by a data signal. The data current signal may be generated by modulating a "modulation current" with the data signal. The modulation current may determine an extent to which the magnitude of the current signal may deviate from the bias current component. However, this is merely an example of a bias current and modulation current, and embodiments of the present invention are not limited in these respects.

The strength of a light signal from a laser device may be associated with a measurable "output power." For example, an output power from a laser device may be measured from a sensor such as a photodiode which is exposed to the light signal. However, this is merely an example of an output power associated with a laser device transmitting a light signal and embodiments of the present invention are not limited in this respect.

An "average output power" as referred to herein relates to an approximation of the mean output power of a laser device over a time period. For example, an average output power may be determined based upon an integration of an output from a sensor over a period of exposure to a light signal generated by the laser device and subsequent normalization. A "swing output power" as referred to herein relates to an amount by which an output power of a laser device may deviate from its lowest value to its highest value over a time period. However, these are merely examples of an average output power and swing output power, and embodiments of the present invention are not limited in these respects.

A "slope efficiency" as referred to herein relates to a relationship between a current signal provided to a laser device and a resulting output power of a light signal generated by the laser device in response to the current signal. For example, a slope efficiency may be expressed as a change in output power divided by a magnitude of a change in current signal. However, this is merely an example of a slope efficiency and embodiments of the present invention are not limited in these respects.

Briefly, an embodiment of the present invention relates to a laser driver circuit to provide a current signal to power a laser device. A bias current provided to the laser device may be changed while changes in the output power of a light signal from the laser device is monitored. A slope efficiency associated with the laser device may be determined based upon the changes in the bias current and changes in the output power. However, this is merely an example embodiment and other embodiments of the present invention are not limited in these respects.

Figure 3:
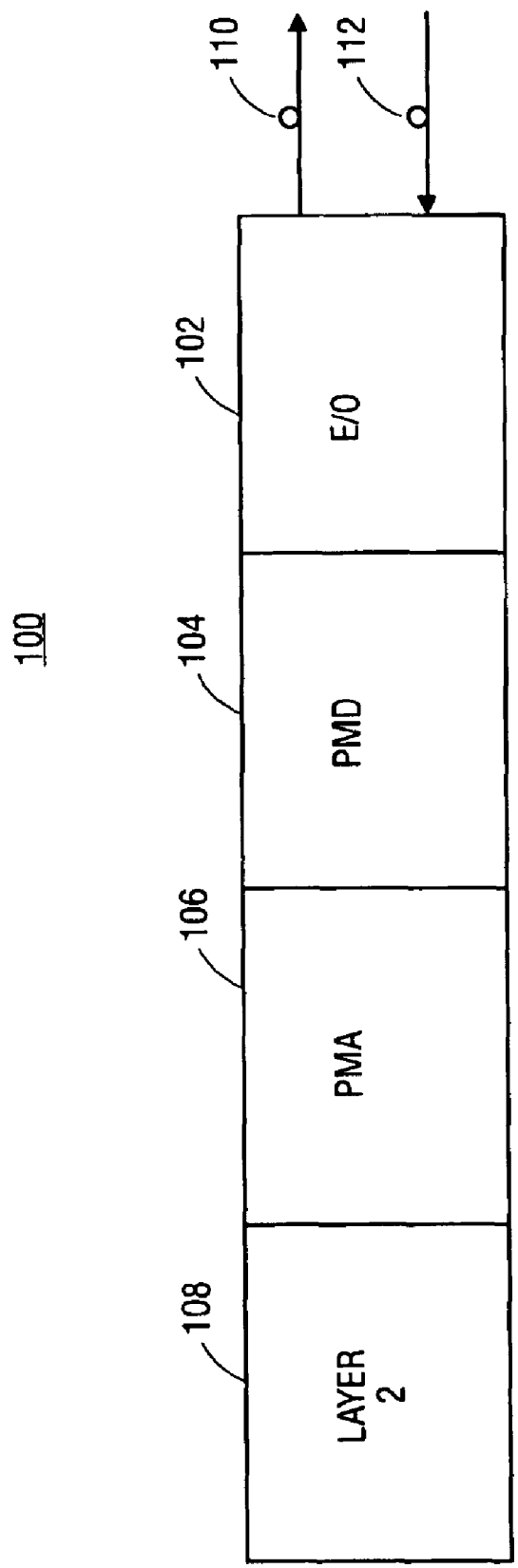
FIG. 3 shows schematic diagram of a system to transmit in and receive data from an optical transmission medium according to an embodiment of the present invention.

FIG. 3 shows a schematic diagram of a system to transmit in and receive data from an optical transmission medium according to an embodiment of the present invention. An optical transceiver 102 may transmit or receive optical signals 110 or 112 in an optical transmission medium such as fiber optic cabling. The optical transceiver 102 may modulate the transmitted signal 110 or demodulate the received signal 112 according to any optical data transmission format such as, for example, wave division multiplexing wavelength division multiplexing (WDM) or multi-amplitude signaling (MAS). For example, a transmitter portion (not shown) of the optical transceiver 102 may employ WDM for transmitting multiple "lanes" of data in the optical transmission medium.

A physical medium dependent (PMD) section 104 may provide circuitry, such as a transimpedance amplifier (TIA) (not shown) and/or limiting amplifier (LIA) (not shown), to receive and condition an electrical signal from the optical transceiver 102 in response to the received optical signal 112. The PMD section 104 may also provide to a laser device (not shown) in the optical transceiver 102 power from a laser driver circuit (not shown) for transmitting an optical signal. A physical medium attachment (PMA) section 106 may include clock and data recovery circuitry (not shown) and de-multiplexing circuitry (not shown) to recover data from a conditioned signal received from the PMD section 104. The PMA section 106 may also comprise multiplexing circuitry (not shown) for transmitting data to the PMD section 104 in data lanes, and a serializer/deserializer (Serdes) for serializing a parallel data signal from a layer 2 section 108 and providing a parallel data signal to the layer 2 section 108 based upon a serial data signal provided by the clock and data recovery circuitry.

According to an embodiment, the layer 2 section 108 may comprise a media access control (MAC) device coupled to the PMA section 106 at a media independent interface (MII) as defined IEEE Std. 802.3ae-2002, clause 46. In other embodiments, the layer 2 section 108 may comprise forward error correction logic and a framer to transmit and receive data according to a version of the Synchronous Optical Network/Synchronous Digital Hierarchy (SONET) protocol as indicated in a set of standards provided by the American National Standards Institute or Synchronous Digital Hierarchy (SDH) as indicated in a set of recommendations provided by the International Telecommunications Union. However, these are merely examples of layer 2 devices that may provide a parallel data signal for transmission on an optical transmission medium, and embodiments of the present invention are not limited in these respects.

The layer 2 section 108 may also be coupled to any of several input/output (I/O) systems (not shown) for communication with other devices in a processing platform. Such an I/O system may include, for example, a multiplexed data bus coupled to a processing system or a multi-port switch fabric.

The layer 2 section 108 may also be coupled to a multi-port switch fabric through a packet classifier device. However, these are merely examples of an I/O system which may be coupled to a layer 2 device and embodiments of the present invention are not limited in these respects.

The layer 2 device 108 may also be coupled to the PMA section 106 by a backplane interface (not shown) over a printed circuit board. Such a backplane interface may comprise devices providing a 10 Gigabit Ethernet Attachment Unit Interface (XAUI) as provided in IEEE Std. 802.3ae-2002, clause 47. In other embodiments, such a backplane interface may comprise any one of several versions of the System Packet Interface (SPI) as defined by the Optical Internetworking Forum (OIF). However, these are merely examples of a backplane interface to couple a layer 2 device to a PMA section and embodiments of the present invention are not limited in these respects.

Figure 4:
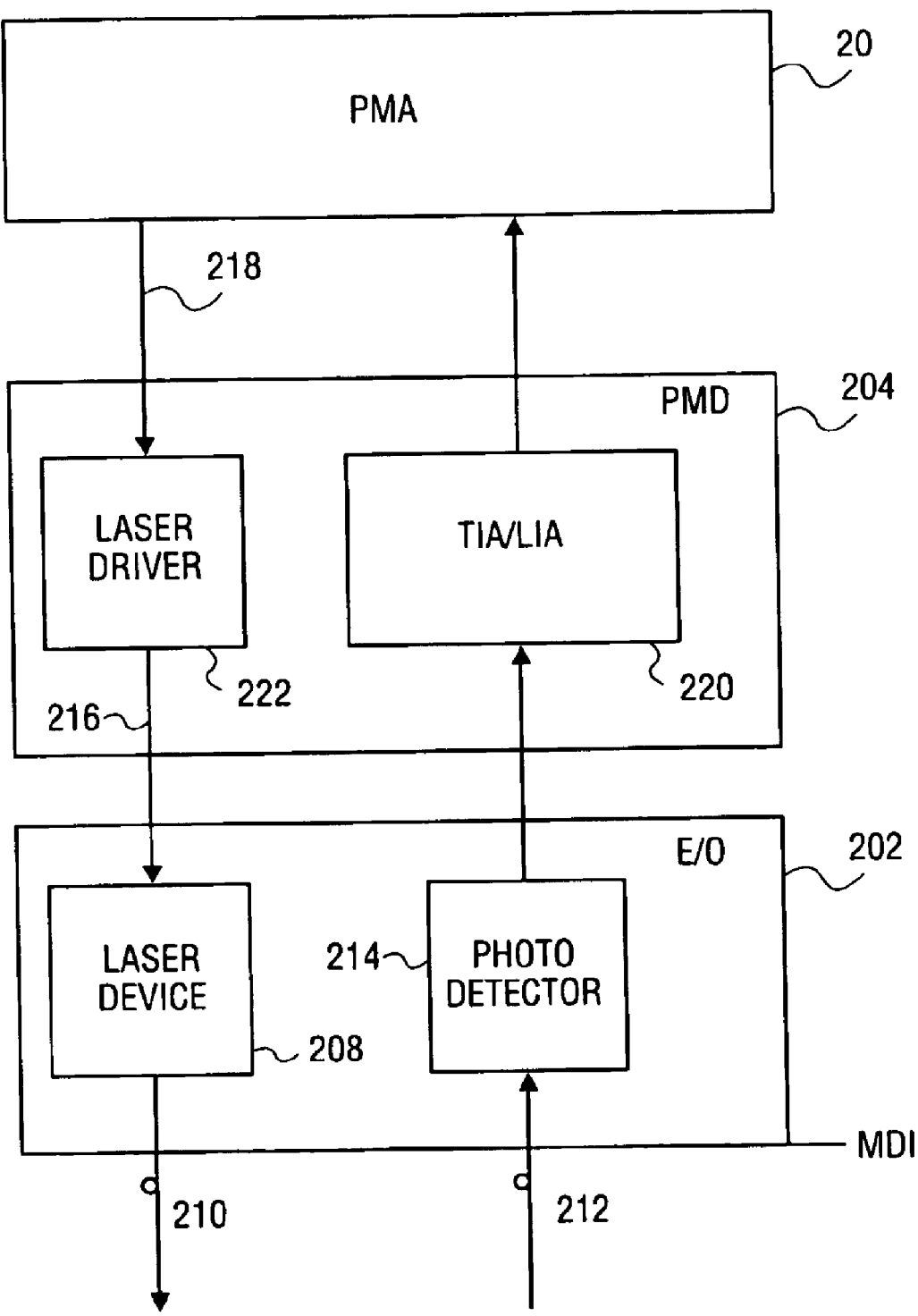
FIG. 4 shows a schematic diagram of physical medium attachment and physical medium dependent sections of a data transmission system according to an embodiment of the system shown in FIG. 2.

FIG. 4 shows a schematic diagram of a system 200 to transmit data in and receive data from an optical transmission medium according to an embodiment of the system shown in FIG. 3. An optical transceiver 202 comprises a laser device 208 to transmit an optical signal 210 in an optical transmission medium and a photo detector section 214 to receive an optical signal 212 from the optical transmission medium. The photo detector section 214 may comprise one or more photodiodes (not shown) for converting the received optical signal 212 to one or more electrical signals to be provided to a TIA/LIA circuit 220. A laser driver circuit 222 may provide a current signal 216 to the laser device 208 in response to a data signal from a PMA section 205. The laser device 208 may then transmit optical signal 210 in response to the current signal 216.

Figure 5:
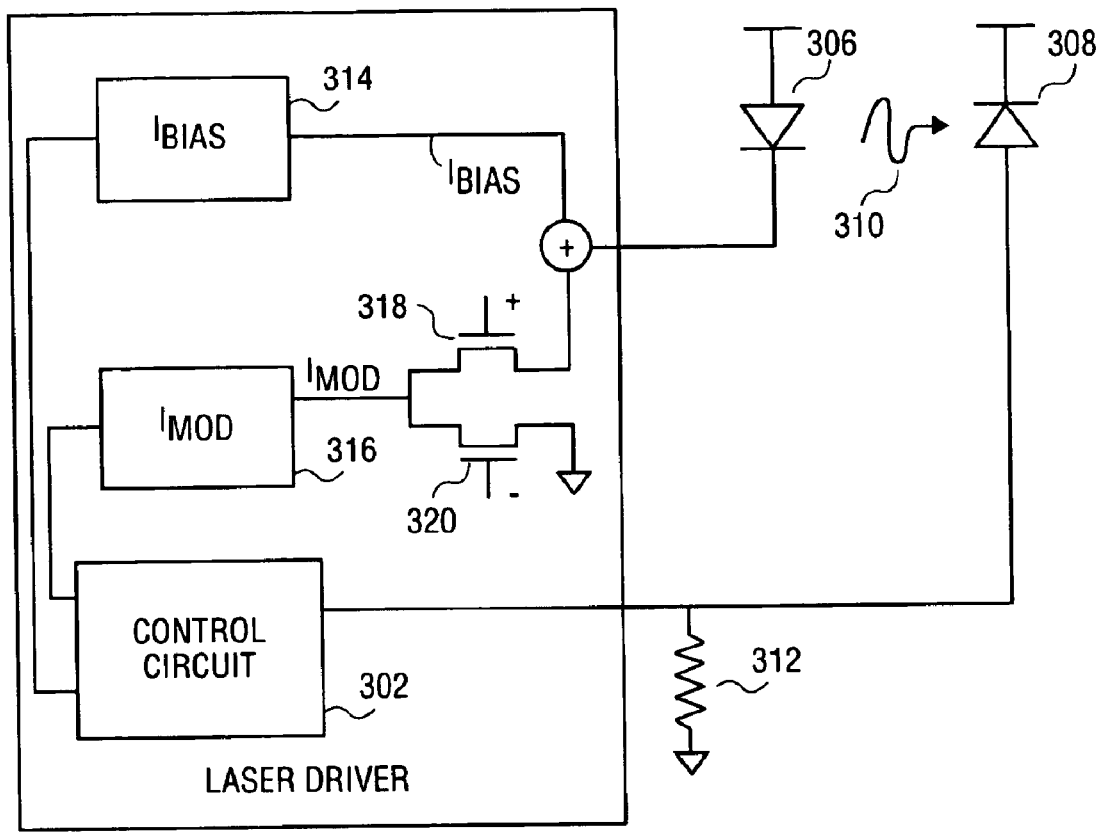
FIG. 5 shows a schematic diagram of a laser driver circuit according to an embodiment of the physical medium dependent section shown in FIG. 4.

FIG. 5 shows a schematic diagram of a laser driver circuit 322 according to embodiment of the physical medium dependent section shown in FIG. 4. A laser device comprising a laser diode 306 receives a current signal from the laser driver circuit 322 and generates a light signal 310 in response to the input current. A photodiode 308 may be used to monitor the output power of the light signal 310 by providing an output current to a control circuit 302 over a resistor 312. A voltage at the resistor may be indicative of the output power of the laser diode 306. Alternatively, instead of passing the output current over the resistor 312, a TIA may be coupled to receive the output current and provide an output voltage to the control circuit 302. However, these are merely examples of how an output power of a laser device may be measured and embodiments of the present invention are not limited in these respects.

The laser driver circuit 322 comprises a current source circuit 316 to generate a modulation current component ($I_{MOD}$) and a current source circuit 314 to generate a bias current component ($I_{BIAS}$). A switch transistor pair comprises switch transistors 318 and 320 to modulate a switched modulation current output in response to a data signal (e.g., from a PMA section) applied to gates of the switch transistors 318 and 320. The switched modulation current and bias current components may be additively combined using techniques known to those of ordinary skill in the art of analog circuit design to provide a current signal for powering the laser diode 306.

In the illustrated embodiment, the current source circuits 314 and 316 may adjust the magnitudes of $I_{MOD}$ or $I_{BIAS}$ in response to control signals from the control circuit 302 to adjust the output power of the laser diode 306. In one embodiment, the current source circuits 314 and 316 may increase or decrease the magnitudes of $I_{MOD}$ or $I_{BIAS}$ continuously over a time period to enable data recovery circuitry at a receiving end (not shown) to respond to changes in the output power. Alternatively, the current source circuits 314 and 316 may change the magnitudes of $I_{MOD}$ or $I_{BIAS}$ as a step function for a faster response. However, these are merely examples of how a modulation current or bias current may be adjusted in response to a control signal and embodiments of the present invention are not limited in these respects.

Figure 6:
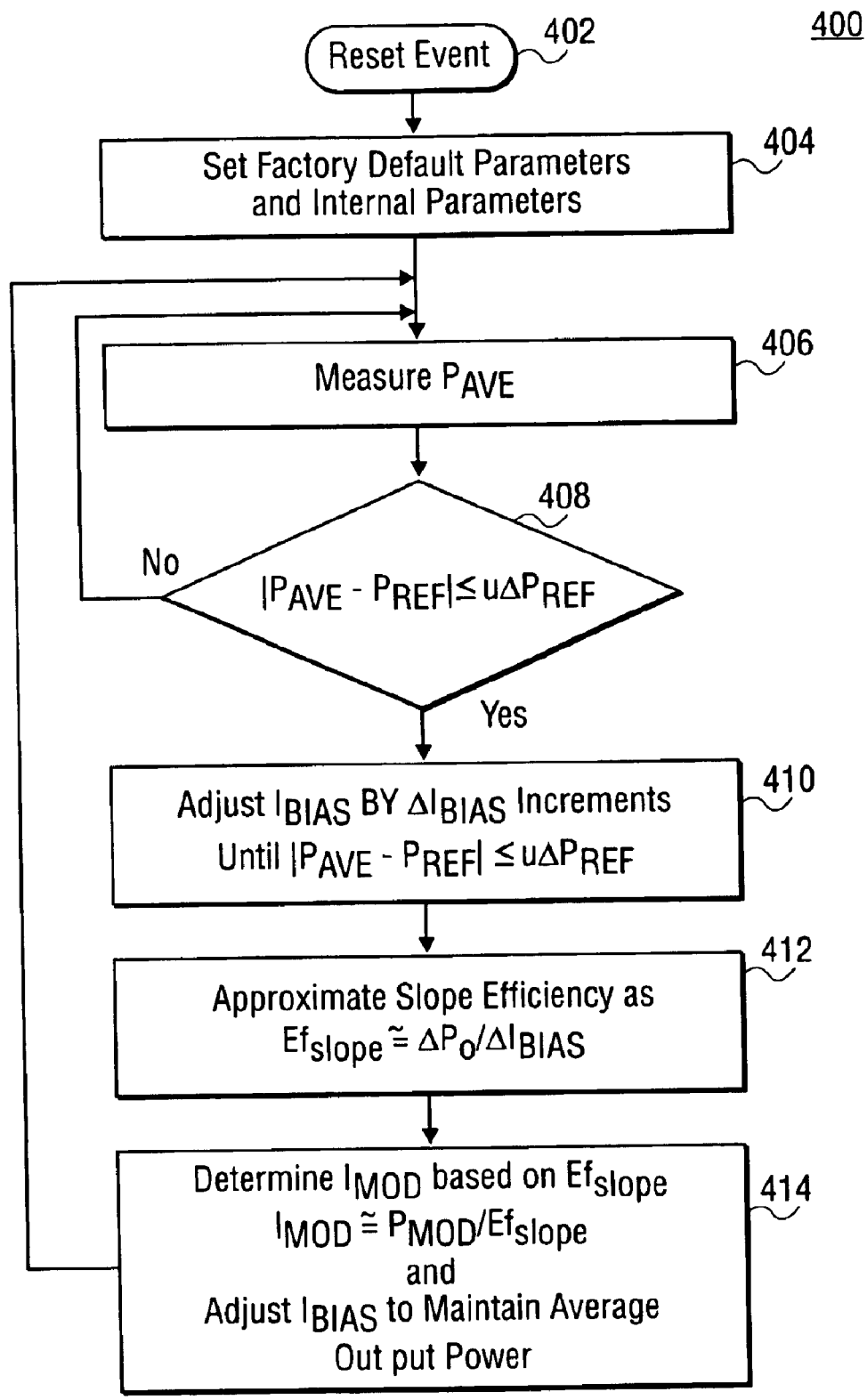
FIG. 6 shows a flow diagram illustrating a process of adjusting an output current of a laser driver circuit according to an embodiment of the laser driver circuit shown in FIG. 5.

According to an embodiment, the laser driver circuit 322 may be associated with preset system parameters (e.g., preset by a manufacturer) such as a target reference average output power ($P_{REF}$) and a target modulation power or swing output power ($P_{MOD}$). FIG. 6 shows a flow diagram illustrating a process 400 to adjust $I_{BIAS}$ and/or $I_{MOD}$ according to an embodiment of the laser driver circuit 322. At bubble 402, a reset event may be detected such as a power up event. Block 404 may set internal parameters and factory default parameters including, for example, $P_{MOD}$ and $P_{REF}$. Blocks 406 through 414 comprise a processing loop that may then be executed until a subsequent reset event.

Block 406 and diamond 408 may detect an event or condition to initiate a change in $I_{BIAS}$ or $I_{MOD}$ to maintain the average output power of the laser diode 306 at about $P_{REF}$. Such an event or condition may include, for example, a change in the temperature of the laser diode 306 (e.g., as measured by a thermistor (not shown)) or a change in the average output power ($P_{AVE}$) from the laser device 306 (e.g., as measured from the output of the photodiode 308). However, these are merely examples of a condition or event that may initiate a change in $I_{BIAS}$ or $I_{MOD}$, and embodiments of the present invention are not limited in these respects. Block 406 measures $P_{AVE}$ and diamond 408 determines whether $P_{AVE}$ is within a suitable range (e.g., as defined in parameters set at block 404) about $P_{REF}$. If $P_{AVE}$ is not within the suitable range about $P_{REF}$, block 408 may adjust $I_{BIAS}$ until $P_{AVE}$ is within the suitable range.

Figure 7:
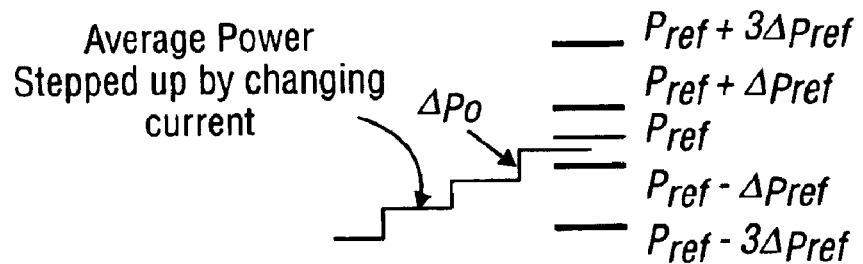
FIG. 7 shows a graph illustrating changes of an output power of a light signal from a laser device in response to changes in an output current from a laser device according to an embodiment of the process shown in FIG. 6.

According to an embodiment the current source circuit 314 may adjust $I_{BIAS}$ in discrete current increments ($\Delta I_{BIAS}$) in response to a digital control signal from the control circuit 302. At block 410, $I_{BIAS}$ may be adjusted by one or more increments $\Delta I_{BIAS}$ (e.g., added to or subtracted from $I_{BIAS}$) until $P_{AVE}$ is within a suitable range. As illustrated in FIG. 7, for example, $I_{BIAS}$ may be adjusted until $P_{AVE}$ is within the range $P_{REF}+/-n\Delta P_{REF}$ where $\Delta P_{REF}$ and n define a predetermined tolerance for $P_{AVE}$.

Following the adjustment of $I_{BIAS}$ at block 410, the control circuit 302 may approximate a slope efficiency ($Ef_{slope}$) associated with the laser diode 306 at block 412. According to the embodiment of FIG. 7, $Ef_{slope}$ may be approximated based upon a discrete current increment $\Delta I_{BIAS}$ and the change in average output power ($\Delta P_o$) resulting from the last current increment $\Delta I_{BIAS}$ added to or subtracted from $I_{BIAS}$ at block 410 (to place $P_{AVE}$ within the range $P_{REF}+/-n\Delta P_{REF}$) as follows:

$$Ef_{slope} = \Delta P_o / \Delta I_{BIAS}$$

According to an embodiment, the control circuit 302 may provide a control signal to the current source circuit 316 to maintain a modulation current $I_{MOD}$. At block 414, the control circuit 302 may determine $I_{MOD}$ based upon $P_{MOD}$ and the slope efficiency approximation $\Delta P_o/\Delta I_{BIAS}$ as follows:

$$I_{MOD} = P_{MOD}/(\Delta P_o/\Delta I_{BIAS})$$

To maintain $P_{AVE}$ within a suitable operating range, $I_{BIAS}$ may be reduced by an amount of current based upon the adjusted modulation current $I_{MOD}$. In the presently illustrated embodiment, it may be assumed that the output power of the laser diode 306 is approximately symmetric about $P_{AVE}$ in response to the modulation current $I_{MOD}$. Accordingly, the bias current $I_{BIAS}$ determined at block 410 may be reduced by about half of any increase to $I_{MOD}$ to maintain $P_{AVE}$ within a suitable operating range. However, this is merely an example of how a bias current may be reduced to maintain the average output power of a laser diode within a suitable range and embodiments of the present invention are not limited in these respects.

Figure 8:
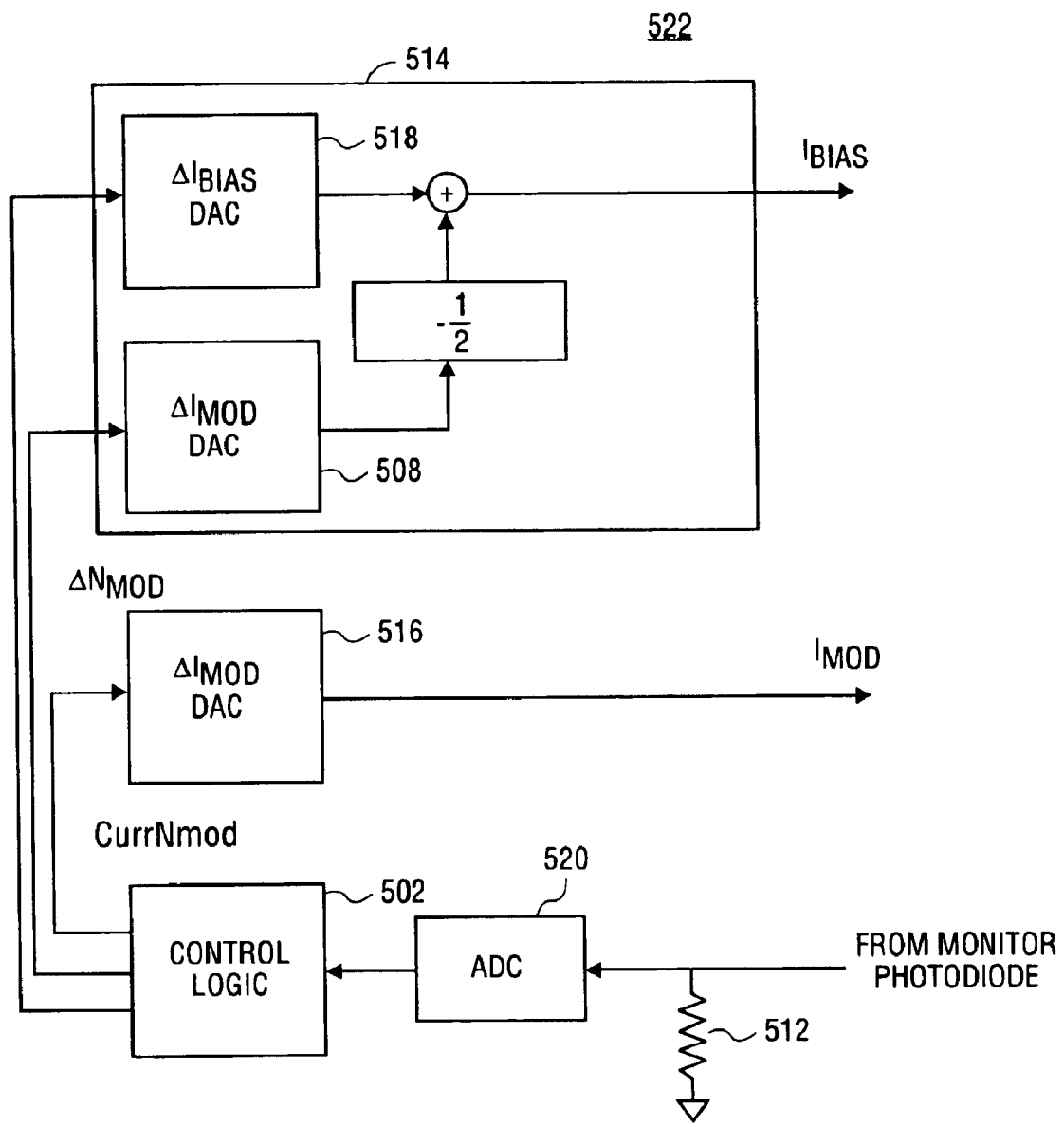
FIG. 8 shows a laser driver circuit according to an embodiment of the laser driver circuit shown in FIG. 5.

FIG. 8 shows a diagram illustrating a laser driver circuit 522 according to an embodiment of the laser driver circuit 322 illustrated with reference to FIGS. 5 and 6. An analog to digital converter (ADC) 520 may provide digital samples of a voltage signal from a monitor photodiode to control logic 502 used for measuring $P_{AVE}$ and $\Delta P_o$ according to an embodiment of the control circuit 302 described with reference to FIG. 6. Current source circuits 514 and 516 each comprise one or more digital-to-analog converters (DACs) to provide a current at a magnitude controlled by a digital signal from the control logic 502. Circuitry to form such DACs to generate a digitally controlled current may be implemented using techniques known to those of ordinary skill in the art of analog circuit design.

Figure 9:
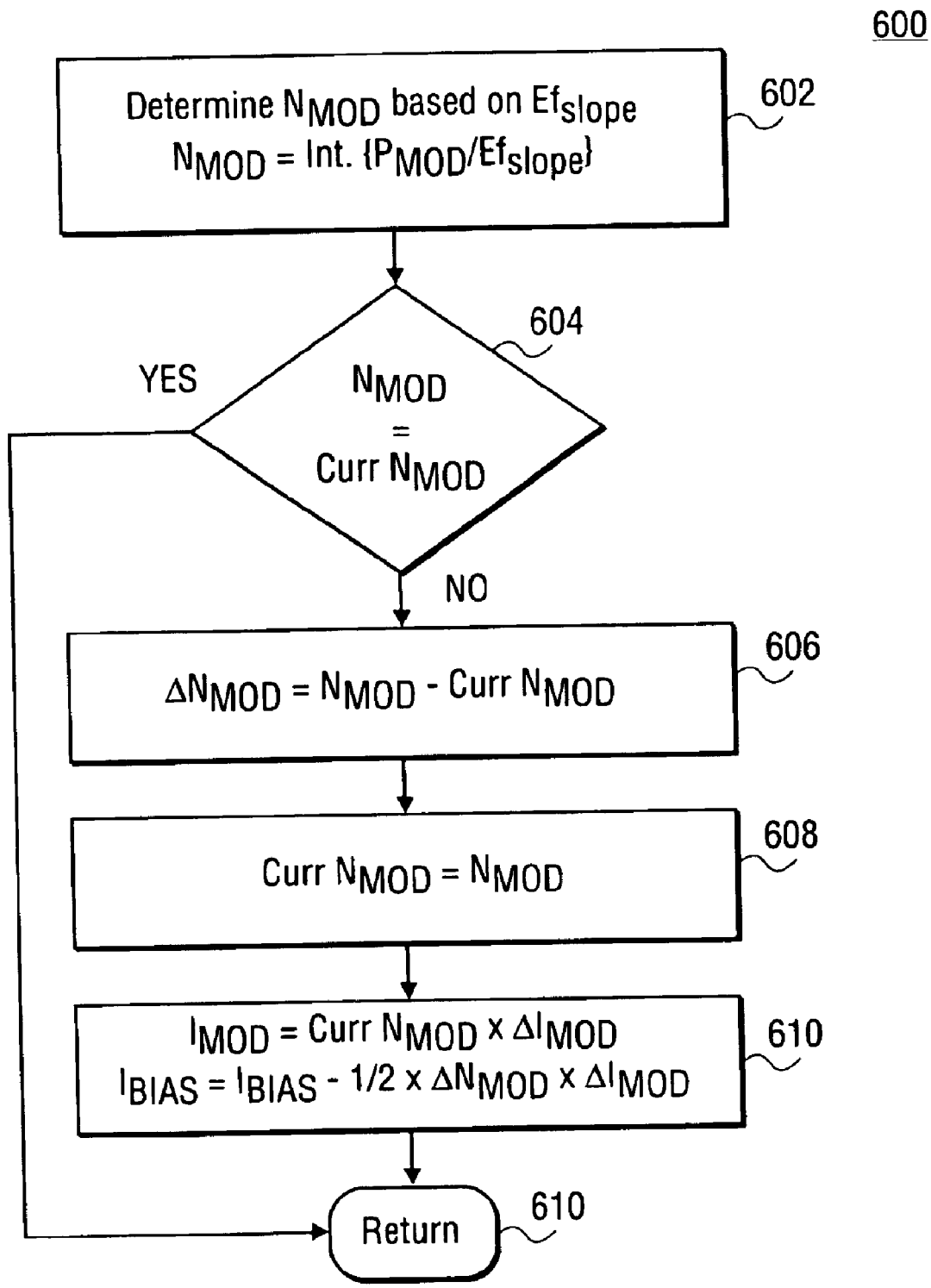
FIG. 9 shows a flow diagram illustrating a process according to an embodiment of the process shown in FIG. 6 and the laser driver circuit shown in FIG. 8.

FIG. 9 shows a flow diagram illustrating a process 600 according to an embodiment of the processing in the block 414 portion of process 400 shown in FIG. 6. and the laser driver circuit 522 shown in FIG. 8. A DAC 516 may generate $I_{MOD}$ as an integer multiple of $\Delta I_{MOD}$ generated as follows:

$$I_{MOD} = N_{MOD} \times \Delta I_{MOD}$$

In the illustrated embodiment, $N_{MOD}$ may be calculated as an integer from the approximated slope efficiency $Ef_{slope}$ (calculated at block 412) and diamond 604 may determine whether there has been a change to $N_{MOD}$ resulting from any change to $Ef_{slope}$. Diamond 604 may compare $N_{MOD}$ as calculated at block 602 to $CurrN_{MOD}$ which is a previously stored value of $N_{MOD}$ (e.g., initialized at block 404 following reset). If $N_{MOD}$ has changed, block 606 may provide an updated $N_{MOD}$ signal as $CurrN_{MOD}$ to DAC 516 to generate $I_{MOD}$ as an integer multiple ($CurrN_{MOD}$) of discrete current increments $\Delta I_{MOD}$.

Since any changes to $I_{MOD}$ (resulting from changes in $N_{MOD}$) may cause a change in $P_{AVE}$, $I_{BIAS}$ may be adjusted to maintain $P_{AVE}$ within a suitable range. At block 410, the control logic 502 may provide a digital control signal to a DAC 518 to increase or decrease the output current from DAC 518 by the discrete current increments $\Delta I_{BIAS}$ to place $P_{AVE}$ within a suitable operating range as illustrated with reference to FIG. 7. At block 606, the control logic 502 may provide signal $CurrN_{MOD}$ as a digital control signal to a DAC 516 to generate $I_{MOD}$ based upon the approximated slope efficiency $Ef_{slope}$.

According to an embodiment, the DAC 516 may provide $I_{MOD}$ as an integer multiple ($N_{MOD}$) of discrete current increments $\Delta I_{MOD}$ based upon $Ef_{slope}$.

Accordingly, the DAC 516 may generate a modulation current $I_{MOD} = CurrN_{MOD} \times \Delta I_{MOD}$ in response to a digital control signal from the control logic 502 to maintain a swing output power at about the target modulation power $P_{MOD}$. To maintain the average power $P_{AVE}$ within a suitable operating range, the current source circuit 514 may offset the output current from the DAC 518. A DAC 508 may generate a current in response to a digital signal $\Delta N_{MOD}$ which represents a change in $CurrN_{MOD}$ (updated at block 608). Here, the DAC 508 may generate a current $\Delta N_{MOD} \times \Delta I_{MOD}$. Half of this output current from the DAC 508 may be subtracted from the output of DAC 518 to provide $I_{BIAS}$ using techniques known to those of ordinary skill in the art of analog circuit design.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method comprising:
    changing a bias current provided to a laser device by discrete current increments;
    measuring changes in an output power of a light signal from the laser device in response to the changes in the bias current;
    estimating a slope efficiency associated with the laser device based upon at least one of the discrete incremental changes in the bias current and at least one change in the output power; and
    determining a magnitude of a modulation current provided to the laser device based upon the estimated slope efficiency and a target output power swing.

2. The method of claim 1, the method further comprises changing the bias current until the output power is within a set or predetermined power range.

3. The method of claim 1, the method further comprising changing the bias current based upon the magnitude of the modulation current to maintain an average of the output power within the set or predetermined range.

4. A laser driver circuit comprising:
    an output power monitoring circuit to determine an output power of a light signal from a laser device;
    a bias current generating circuit to change a bias current provided to a laser device in discrete current increments;
    a circuit to estimate a slope efficiency associated with the laser device based upon at least on of the discrete incremental changes in the bias current and at least one change in the output power; and
    a modulation current generating circuit to determine a magnitude of a modulation current provided to the laser device based upon the estimated slope efficiency and a target output power swing.

5. The laser driver circuit of claim 4, wherein the bias current generating circuit changes the bias current until the output power is within a set or predetermined power range.

6. The laser driver circuit of claim 4, wherein the bias current generating circuit comprises logic to change the bias current based upon the magnitude of the modulation current to maintain an average of the output power within the set or predetermined range.

7. A system comprising:
    a serializer to provide a serial data signal in response to a parallel data signal;
    a laser device adapted to be coupled to an optical transmission medium to transmit an optical signal in the optical transmission medium in response to the serial data signal; and a laser driver circuit to provide a power signal to the laser device, the laser driver circuit comprising:
an output power monitoring circuit to measure an output power of a light signal from the laser device;
a bias current generating circuit to change a bias current to the laser device in discrete current increments;
a circuit to estimate a slope efficiency associated with the laser device based upon at least one of the discrete incremental changes in the bias current and at least one change in the output power; and
a modulation current generating circuit to determine a magnitude of a modulation current provided to the laser device based upon the estimated slope efficiency and a target output power swing.

8. The system of claim 7, the system further comprising a SONET framer to provide the parallel data signal.

9. The system of claim 8, wherein the system further comprises a switch fabric coupled to the SONET framer.

10. The system of claim 7, the system further comprising an Ethernet MAC to provide the parallel data signal at a media independent interface.

11. The system of claim 10, wherein the system further comprises a multiplexed data bus coupled to the Ethernet MAC.

12. The system of claim 10, wherein the system further comprises a switch fabric coupled to the Ethernet MAC.

13. A system comprising:
a serializer to provide a serial data signal in response to a parallel data signal;
a laser device adapted to be coupled to an optical transmission medium to transmit an optical signal in the optical transmission medium in response to the serial data signal; and
a laser driver circuit to provide a power signal to the laser device, the laser driver circuit comprising:
a first current source circuit to generate a bias current;
a second current source circuit to generate a modulation current; and
a control circuit coupled to the second current source to control a magnitude of the modulation current based upon one or more changes in a magnitude of the bias current and one or more changes in an output power of a light signal transmitted by the laser device;
wherein the control circuit further comprises:
logic to adjust the magnitude of the modulation current to maintain a swing power of the laser device at about a predetermined target modulation power.

14. The system of claim 13, the system further comprising a SONET framer to provide the parallel data signal.

15. The system of claim 14, wherein the system further comprises a switch fabric coupled to the SONET framer.

16. The system of claim 13, the system further comprising an Ethernet MAC to provide the parallel data signal at a media independent interface.

17. The system of claim 16, wherein the system further comprises a multiplexed data bus coupled to the Ethernet MAC.

18. The system of claim 16, wherein the system further comprises a switch fabric coupled to the Ethernet MAC.

19. The system of claim 13, wherein the control circuit comprises logic coupled to the first current source to change the magnitude of the bias current to maintain the average output power of the light signal within a predetermined range.

20. The system of claim 19, wherein the control circuit further comprises:
logic to reduce the bias current based to maintain an average output power of the light signal at about a predetermined target average output power based upon the adjusted magnitude of the modulation current.

21. The system of claim 13, the laser driver circuit further comprising:
a modulation circuit to generate a modulated current signal in response to the modulation current and a data signal; and
a circuit to combine the bias current and the modulated current signal to provide a current signal to the laser device.

22. The system of claim 13, wherein the control circuit further comprises:
an analog to digital conversion circuit to sample a voltage representative of the output power of the laser device; and
a first signal output to provide a first digital control signal to the first current source circuit; and
a second signal output to provide a second digital control signal to the second current source circuit.

23. The system of claim 13, wherein the bias current generating circuit changes the bias current until the output power is within a set of predetermined power range.

24. The system of claim 23, wherein the laser driver circuit comprises a modulation current generating circuit to determine a magnitude of a modulation current provided to the laser device based upon the estimated slope efficiency and a target output power swing.

25. The system of claim 24, wherein the bias current generating circuit comprises logic to change the bias current based upon the magnitude of the modulation current to maintain an average of the output power within the set or predetermined range.

* * * * *